(12) United States Patent
Kawashima et al.

(10) Patent No.: US 7,237,332 B2
(45) Date of Patent: Jul. 3, 2007

(54) METHOD OF MANUFACTURING WIRING BOARD

(75) Inventors: Toshiyuki Kawashima, Ibaraki (JP); Nobuharu Tahara, Ibaraki (JP); Kenichi Ikeda, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 274 days.

(21) Appl. No.: 10/820,417

(22) Filed: Apr. 7, 2004

(65) Prior Publication Data

US 2004/0187305 A1    Sep. 30, 2004

Related U.S. Application Data

(62) Division of application No. 10/127,065, filed on Apr. 19, 2002, now abandoned.

(30) Foreign Application Priority Data

Apr. 23, 2001  (JP) .............................. 2001-124195

(51) Int. Cl.
*H05K 3/36* (2006.01)
(52) U.S. Cl. ........................ 29/830; 29/825; 174/258
(58) Field of Classification Search .................. 29/825, 29/830; 174/258
See application file for complete search history.

(56) References Cited

U.S. PATENT DOCUMENTS

| | | | |
|---|---|---|---|
| 4,180,608 A | 12/1979 | Del | |
| 4,751,146 A | 6/1988 | Maeda et al. | |
| 5,213,227 A | 5/1993 | Koyama et al. | |
| 5,349,155 A | 9/1994 | Yamagishi et al. | |
| 5,473,118 A * | 12/1995 | Fukutake et al. | 174/258 |
| 5,588,207 A | 12/1996 | Kawakita et al. | |
| 5,847,327 A | 12/1998 | Fischer et al. | |
| 5,879,787 A | 3/1999 | Petefish | |
| 6,033,765 A | 3/2000 | Takahashi et al. | |
| 6,197,407 B1 | 3/2001 | Ando et al. | |
| 6,398,899 B1 * | 6/2002 | Umezawa et al. | 156/245 |
| 6,465,742 B1 * | 10/2002 | Hiraoka et al. | 174/255 |
| 6,518,514 B2 * | 2/2003 | Suzuki et al. | 174/262 |
| 6,740,606 B2 * | 5/2004 | Umezawa et al. | 442/43 |
| 6,780,493 B2 * | 8/2004 | Noda et al. | 428/209 |
| 2002/0189088 A1 | 12/2002 | Kawashima et al. | |

FOREIGN PATENT DOCUMENTS

JP    9-324060    12/1997

* cited by examiner

*Primary Examiner*—Carl J. Arbes
(74) *Attorney, Agent, or Firm*—Knobbe Martens Olson & Bear, LLP (57) ABSTRACT

The present invention provides a method of manufacturing a wiring board, including the steps of preparing a composite sheet having an adherent sheet containing a thermosetting resin adhered to a porous film or impregnated with at least a part thereof, laminating at least the composite sheet on a wiring layer having a wiring pattern formed on an insulating layer, and heating and pressurizing the laminated product thus obtained or heating and pressurizing it after the pressurization to integrate the laminated product.

5 Claims, 5 Drawing Sheets

METHOD OF MANUFACTURING WIRING BOARD

This is a divisional application of U.S. application Ser. No. 10/127,065 filed Apr. 19, 2002, now abandoned which claims priority to Japanese Patent Application No. 2001-124195 filed Apr. 23, 2001, and the disclosure of which is incorporated herein by reference in its entirety.

BACKGROUND OF THE INVENTION

1. Field of the Invention

The present invention relates to a method of manufacturing a wiring board including a manufacturing step of forming an insulating layer having a flat upper surface on a wiring layer having a wiring pattern, a composite sheet for manufacturing a wiring board to be used therein, and a wiring board which can be obtained by the manufacturing method. The present invention is prefer for a method of manufacturing a multilayer wiring board.

2. Description of the Related Art

In the steps of forming a core substrate, an insulating layer or the like of a printed wiring board to be used in electronic equipment or the like, conventionally, there has been used a prepreg in which a glass fiber fabric or a polymer nonwoven fabric is impregnated with a thermosetting resin and is half cured. The prepreg is thermally pressed together with copper foils provided on both surfaces, for example, so that a double-sided copper foils laminated plate can be obtained, and a wiring pattern is formed on the copper foil and can be thus used as the core substrate of a multilayer wiring board.

In recent years, the wiring board has a finer wiring pattern because of the high integration of a wiring, and furthermore, a multilayer structure is achieved and each layer is thinned. For this reason, in the case in which a glass fiber fabric impregnated with an epoxy resin is used for the prepreg, there is a problem in that drilling is carried out with difficulty due to a glass fiber when laser via processing is to be carried out. Therefore, there have been proposed various prepregs using, for a reinforcing phase, a polymer nonwoven fabric on which the laser via processing can be carried out more easily.

When an insulating layer is formed on a wiring layer having a wiring pattern by using the prepreg having the polymer nonwoven fabric for the reinforcing phase, however, a flat insulating layer is formed with difficulty due to the unevenness of the wiring pattern. And a wiring layer to be an upper layer is not flat. Consequently, there is a problem in that the step of providing an upper layer to be carried out subsequently is hindered. For this reason, in a multilayer wiring board having each layer thinned, there have been particularly employed a method of applying a thermosetting resin in place of the provision of a prepreg and a method of providing a thermosetting resin sheet to form an insulating layer. In these methods, since the reinforcing phase is not present, it is hard to control a gap for forming an insulating layer. Thus, the methods are not advantageous in respect of mass production.

In place of the polymer nonwoven fabric, there has also been known a prepreg using a porous film formed of aromatic polyamide (Japanese Laid-Open Patent Publication No. Hei 9-324060). Such a prepreg is usually used for manufacturing a double-sided copper foil laminated plate having a copper foil integrated on both surfaces thereof and is used for fabricating a core substrate.

Therefore, it is an object of the present invention to provide a method of manufacturing a wiring board which is advantageous to mass production because an insulating layer having a flat upper surface can be formed on a wiring layer, and furthermore, a gap for forming the insulating layer can be controlled easily, a composite sheet for manufacturing a wiring board to be used for the method, and a wiring board which can be obtained by the same method.

SUMMARY OF THE INVENTION

The present inventors vigorously made investigations in order to achieve the object and found that the object can be achieved by using a composite sheet having an adherent sheet adhered to a porous film or impregnated with at least a part thereof instead of providing a thermosetting resin sheet to form an insulating layer, so that the present invention was completed.

More specifically, the present invention provides a method of manufacturing a wiring board, comprising the steps of: preparing a composite sheet having an adherent sheet containing a thermosetting resin adhered to a porous film or impregnated with at least a part thereof; laminating at least the composite sheet on a wiring layer having a wiring pattern formed on an insulating layer; and heating and pressurizing the laminated product thus obtained or heating and pressurizing it after the pressurization to integrate the laminated product.

According to the method of manufacturing a wiring board in accordance with this invention, the composite sheet having the adherent sheet containing the thermosetting resin and the porous film is used. As shown in the result of an example, therefore, an insulating layer having a flatter upper surface can be formed on the wiring layer as compared with the case in which a prepreg including a polymer nonwoven fabric is used. Moreover, the porous film has the function of a spacer. Therefore, gap control for the insulating layer can be carried out easily by the pressing force. Thus, it is possible to provide the manufacturing method which is advantageous to mass production.

In the above method, it is preferable that the composite sheet having the adherent sheet adhered to the porous film or impregnated with a part thereof should be used, and that the laminating step should be carried out with the porous film side of the composite sheet arranged on the wiring layer. Consequently, the porous film which is not impregnated with the adherent sheet is pressed in contact with the wiring pattern of the wiring layer early. Therefore, the wiring pattern can easily be put in the porous film. As a result, it is possible to form an insulating layer having a flat upper surface more reliably without productivity loss.

On the other hand, the present invention provides a composite sheet for manufacturing a wiring board is provided on a wiring layer having a wiring pattern formed on an insulating layer and is thus used, and has an adherent sheet containing a thermosetting resin adhered to a porous film or impregnated with at least a part thereof. According to the composite sheet for manufacturing a wiring board, by the functions and effects described above, the insulating layer having the flat upper surface can be formed on the wiring layer, and furthermore, a gap for forming the insulating layer can easily be controlled. Therefore, it is possible to obtain a manufacturing method which is advantageous to the mass production of the wiring board.

Furthermore, the present invention provides a wiring board having a lamination structure in which a wiring layer having a wiring pattern formed on an insulating layer and a composite insulating layer obtained by curing a thermosetting resin impregnated in a porous film are laminated and integrated, the wiring pattern being put in the porous film. According to the wiring board, the wiring layer and the composite insulating layer obtained by curing the thermosetting resin impregnated in the porous film have the lamination structure with the wiring pattern put in the porous film. Therefore, the composite insulating layer has a flat upper surface. In addition, the gap for forming the insulating layer can easily be controlled. Consequently, it is possible to obtain a wiring board which is advantageous to mass production.

DETAILED DESCRIPTION OF THE PREFERRED EMBODIMENT

Preferred embodiments of the present invention will be described as first to fifth embodiments and a composite sheet to be used therefore in this order.

First Embodiment

Figure 1:
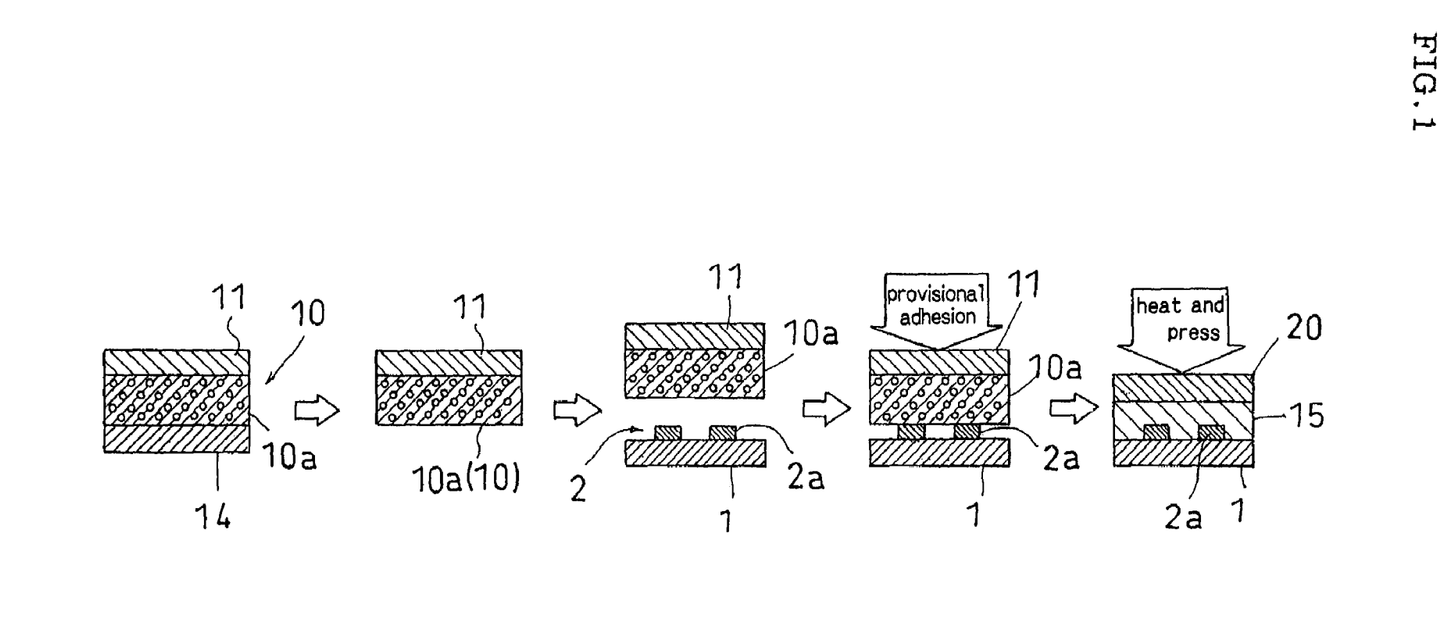
FIG. 1 is a view showing a step of a method of manufacturing a wiring board according to a first embodiment of the present invention.

A method of manufacturing a wiring board according to the present invention includes the step of heating and pressurizing or heating and pressurizing after pressurizing to integrate a laminated product in which a composite sheet 10 having an adherent sheet containing a thermosetting resin adhered to a porous film or impregnated with at least a part thereof is at least provided on a wiring layer 2 having a wiring pattern 2a on an insulating layer 1 as shown in FIG. 1. The composite sheet 10 will be described below in detail.

The wiring layer 2 according to the present invention may be provided with a wiring pattern 2a formed on a core substrate or may be an upper wiring layer. The wiring pattern 2a may be formed by pattern etching a metal foil by using an etchant, for example, or carrying out pattern plating. For the etching, an etchant corresponding to the kind of metal can be used, and a dry film resist or the like can be used for the pattern etching.

In the first embodiment, as shown in FIG. 1, a whole impregnated porous film 10a which is obtained by a porous film wholly impregnated with an adherent sheet containing a thermosetting resin is used for the composite sheet 10. In this example, a laminated product can be integrated by a comparatively simple step.

First of all, there is prepared the whole impregnated porous film 10a to be the composite sheet 10 having both surfaces on which releasing resin films 11 and 14 are provided. Examples of the resin films 11 and 14 include a polyester film such as polyethylene terephthalate or polyethylene naphthalate(PEN), a polyolefin film such as polyethylene or polypropylene, a polyamide film and a polyimide film. For the lamination, lamination arrangement may be simply obtained or it is preferable that pressure bonding should be carried out by utilizing the adhesion of the whole impregnated porous film 10a. Moreover, the composite sheet 10 may be obtained by previously forming a porous film 13 on a resin film and then impregnating the porous film 13 with an adhesive sheet 12.

In other words, the composite sheet 10 of the present invention is a composite sheet for manufacturing a wiring board which is provided on the wiring layer 2 having the wiring pattern 2a formed on the insulating layer 1 and is thus used, and includes a porous film having an adhesive sheet containing a thermosetting resin adhered thereto or impregnated with at least a part thereof.

Next, the lower resin film 14 among the resin films 11 and 14 is peeled and is mounted on the wiring layer 2 having the wiring pattern 2a formed on the insulating layer 1. This is provisionally adhered at a comparatively low temperature and pressure (for example, at a temperature of 100° C. or less and a pressure of 0.1 to 1 MPa) such that only the upper resin film 11 can easily be peeled. After the provisional adhesion, only the film 11 is peeled and an upper layer material 20 is then mounted thereon and is heated and pressurized. Thus, the upper layer material 20 is laminated and integrated with a laminated product.

Examples of the upper layer material 20 include a metal foil such as a copper foil, an insulating material constituting an insulating layer, an insulating material having a metal foil on an upper surface, and an insulating base material having a wiring pattern formed on a lower surface or both surfaces. In the case in which the metal foil is used, it is possible to use copper, cupro-nickel, bronze, brass, aluminum, nickel, iron, stainless, gold, silver or platinum. It is preferable that the metal foil should have a thickness of 1 to 50 μm. In the present invention, it is particularly preferable that a copper foil suitable for the wiring pattern of a wiring board is used. The surface of the metal foil may be subjected to various physical or chemical surface finishing processes, for example, a rough surfacing process or a blacking process in order to enhance adhesion with the composite sheet 10.

For the heating and pressurization, it is possible to use various pressurizer such as a vacuum pressurizer, a thermal pressurizer and a continuous pressurizer. Moreover, any of conventional known conditions can be applied to the temperature and pressure of the thermal press. In the present invention, the temperature and the pressure are properly set depending on the type of the thermosetting resin impregnated in the whole impregnated porous film 10a, for example, a temperature of 100 to 200° C. and a pressure of 0.5 to 5 MPa are preferable.

In the case in which the upper layer material 20 is a metal foil, a wiring pattern is formed by a conventional method and an insulating layer and a wiring layer are further provided if necessary so that a wiring board having a multiplayer structure is manufactured. Also in the case in which the upper layer material 20 is one of other materials, moreover, a multilayer structure having an insulating layer and a wiring layer sequentially provided can be basically formed.

Furthermore, it is also possible to form a conductive connection structure in which wiring layers are conductively connected to each other. Such a conductive connection structure includes a method of filing a via hole with a conductive paste, a method of plating the inside of a via hole and the like. Examples of a method of forming a via hole include drilling, a punch, laser processing using various lasers, for example, a YAG laser and the like.

The wiring board of the present invention has the lamination structure in which the wiring layer 2 having a wiring pattern 2a formed on the insulating layer 1 and the composite insulating layer 15 having a thermosetting resin impregnated and cured in a porous film are laminated and integrated, in a state that the wiring pattern 2a is put in the porous film as described above.

Second Embodiment

Figure 2:
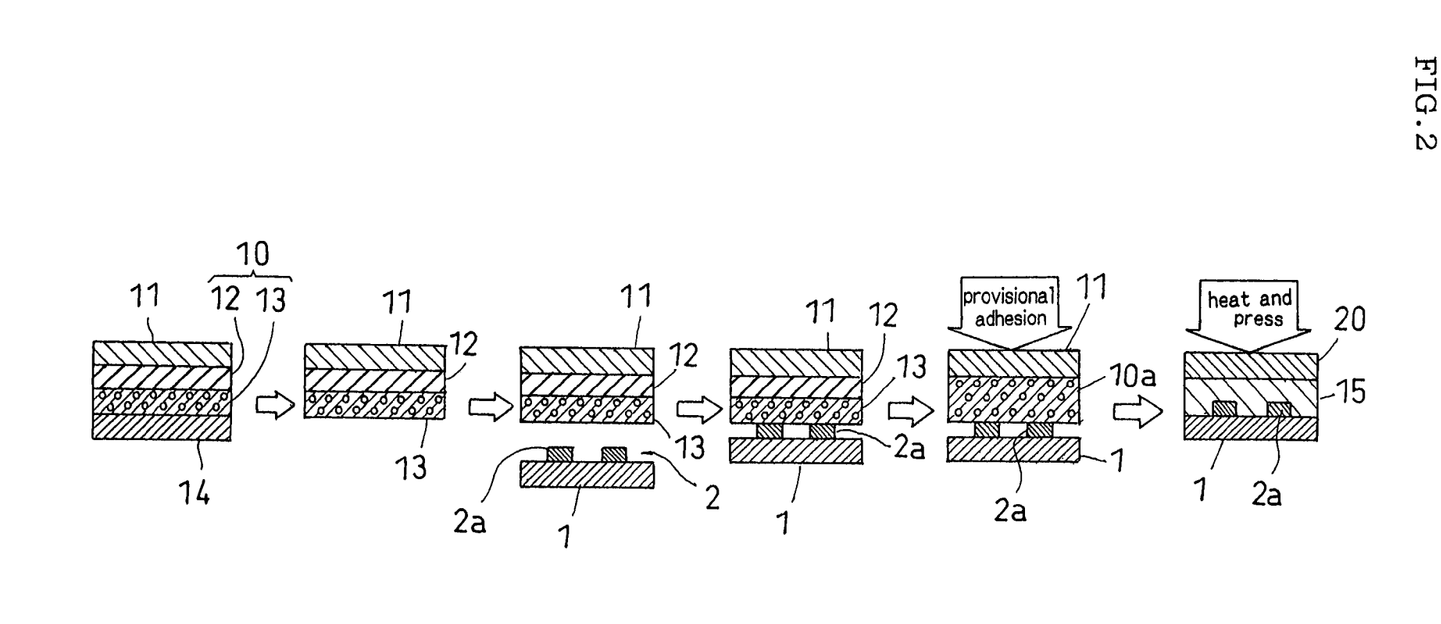
FIG. 2 is a view showing a step according to a second embodiment.

In a second embodiment, as shown in FIG. 2, there is used a composite sheet 10 having an adherent sheet 12 containing a thermosetting resin adhered to a porous film 13. A difference from the first embodiment will be described below. The composite sheet 10 is obtained by adhering the adherent sheet 12 to the porous film 13 on a boundary surface. Similarly, it is also possible to use a composite sheet 10 in which the porous film 13 is partially impregnated with the adherent sheet 12 on the boundary thereof.

First of all, mold-releasing films 11 and 14 are provided on both surfaces of the composite sheet 10. Next, the lower resin film 14 among the resin films 11 and 14 is peeled and is mounted on the wiring layer 2 having a wiring pattern 2a formed on an insulating layer 1. This is provisionally bonded at a comparatively low temperature and pressure (for example, at a temperature of 100° C. or less and a pressure of 0.1 to 1 MPa) and the porous film 13 is impregnated with the adherent sheet 12 such that only the upper resin film 11 can easily be peeled. After the provisional bonding, only the film 11 is peeled and an upper layer material 20 is then mounted thereon and is heated and pressurized. Thus, the upper layer material 20 is laminated and integrated with a laminated product.

Third Embodiment

Figure 3:
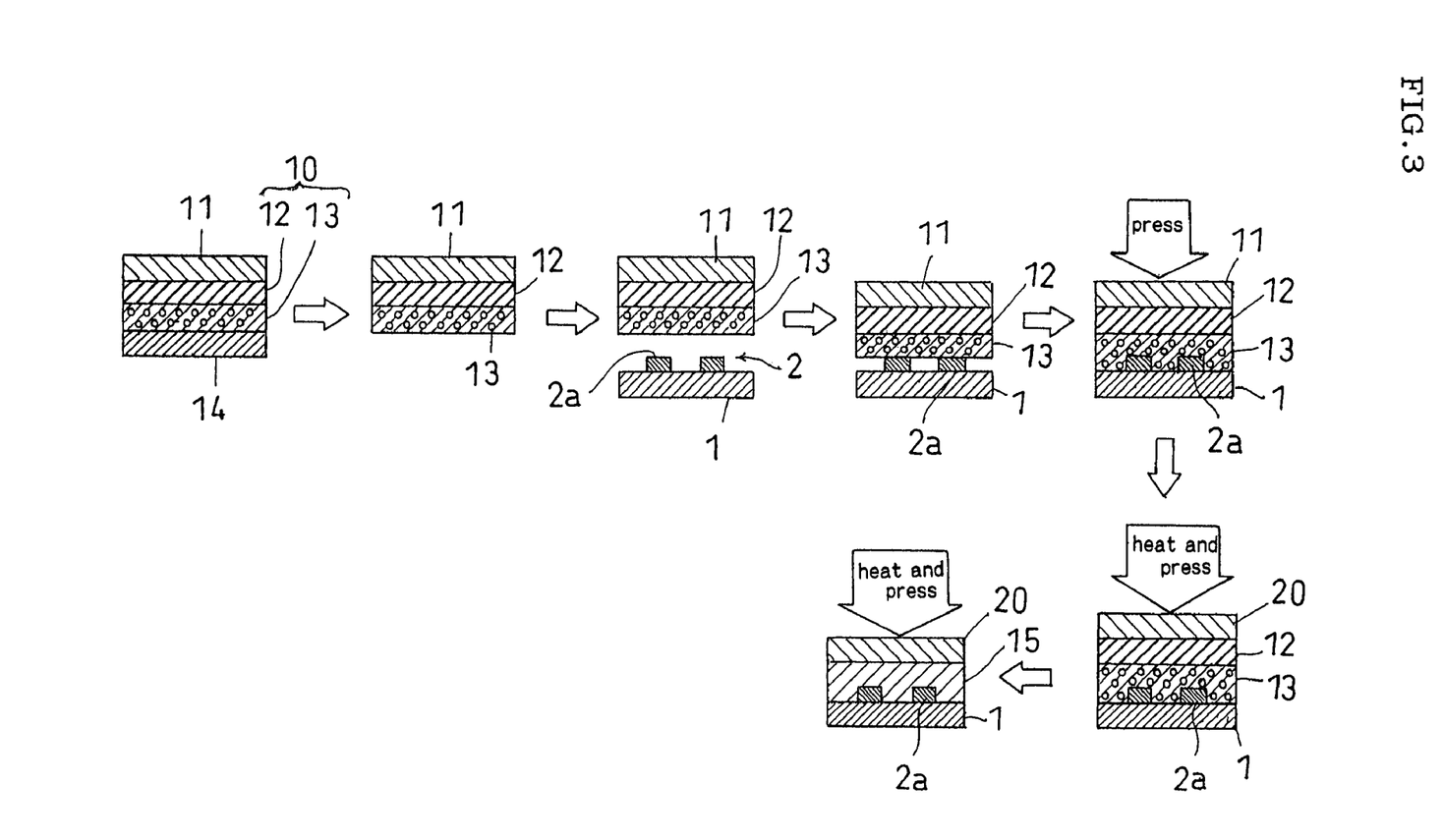
FIG. 3 is a view showing a step according to a third embodiment.

In a third embodiment, as shown in FIG. 3, the same composite sheet 10 as that of the second embodiment is used, and heating and pressurization are carried out after prepressurization in place of heating and pressurization. In the following, a different portion from the second embodiment will be described. Also in the third embodiment, similarly, it is possible to use a composite sheet 10 having a porous film 13 partially impregnated with an adherent sheet 12.

The composite sheet from which a resin film 14 is peeled is mounted on a wiring layer 2 in the same manner as described above. This is substantially pressurized at such a temperature that the porous film 13 is not impregnated with the adherent sheet 12 (for example, at a temperature of 50° C. or less and a pressure of 0.1 to 5 MPa) to put a wiring pattern 2a in the porous film 13. Next, only the film 11 is peeled and an upper layer material 20 is then mounted and is heated and pressurized. Thus, the upper layer material 20 is laminated and integrated with a laminated product.

Fourth Embodiment

Figure 4:
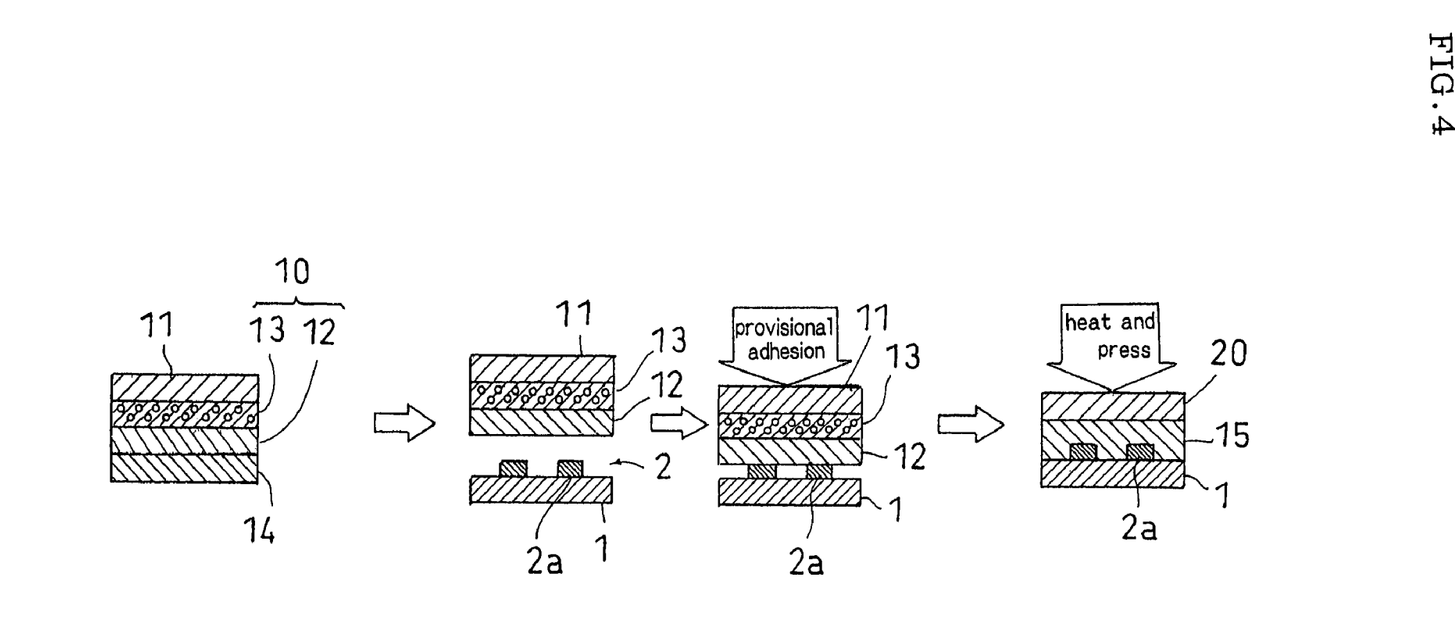
FIG. 4 is a view showing a step according to a fourth embodiment.

In a fourth embodiment, as shown in FIG. 4, there is used a composite sheet 10 in which an adherent sheet 12 containing a thermosetting resin is adhered to a porous film 13 and the adherent sheet 12 side is mounted on a wiring layer 2. In the following, a difference from the second embodiment will be described. The composite sheet 10 is obtained by adhering the adherent sheet 12 to the porous film 13 on a boundary surface. Similarly, it is also possible to use a composite sheet 10 in which the porous film 13 is partially impregnated with the adherent sheet 12 on the boundary thereof.

First of all, releasing films 11 and 14 are provided on both surfaces of the composite sheet 10 having the adherent sheet 12 on the lower side in the drawing. Next, the lower resin film 14 is peeled and is mounted on the wiring layer 2 having a wiring pattern 2a formed on an insulating layer 1. This is provisionally adhered at a comparatively low temperature and pressure (for example, at a temperature of 100° C. or less and a pressure of 0.1 to 1 MPa) such that only the upper resin film 11 can easily be peeled. After the provisional bonding, only the film 11 is peeled and an upper layer material 20 is then mounted thereon and is heated and pressurized. Thus, the upper layer material 20 is laminated and integrated with a laminated product.

Fifth Embodiment

Figure 5:
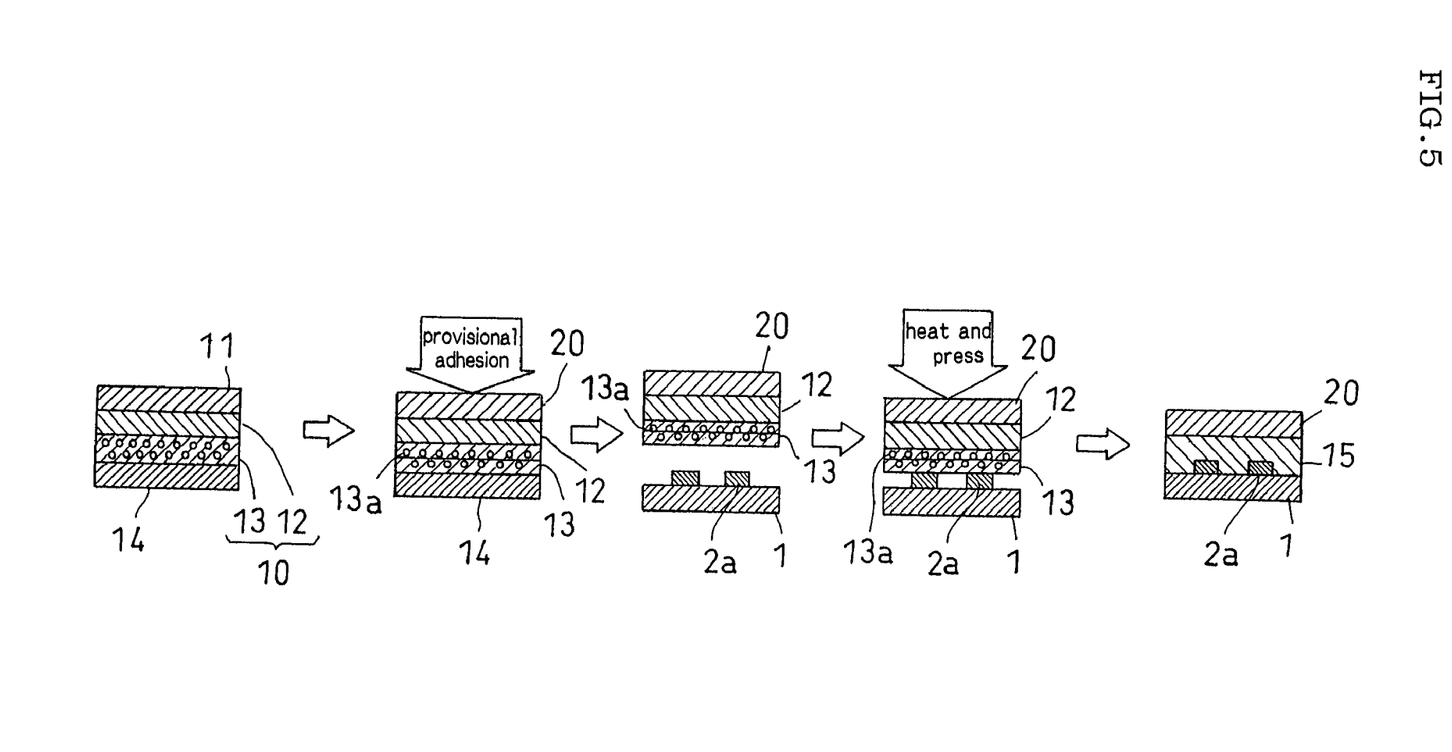
FIG. 5 is a view showing a step according to a fifth embodiment.

While the example in which an upper layer material 20 is laminated immediately before heating and pressurization has been described in the above embodiments, as shown FIG. 5, in this embodiment, the upper layer material 20 is provisionally adhered in advance, and then an adherent sheet 12 is impregnated in a porous film 13 and is laminated and integrated therewith during heating and pressurization. It is also possible to use any one of the composite sheet 10 according to the first to fourth embodiments. Moreover, 13a denotes a portion in which the porous film 13 is impregnated with the adherent sheet 12.

First of all, releasing films 11 and 14 are provided on both surfaces of the composite sheet 10. Next, the upper resin film 11 is peeled and the upper layer material 20 is mounted and is provisionally adhered, and is then laminated and integrated with the composite sheet 10. After the lower resin film 14 of the composite sheet 10 is peeled, the composite sheet 10 is mounted on the wiring layer 2 having a wiring pattern 2a. The laminated product is heated and pressurized and porous film 13 is impregnated with the adherent sheet 12 and the upper layer material 20 is simultaneously laminated and integrated with the laminated product.

Referring to the present embodiment, in the case in which a metal foil is used for the upper layer material 20, the porous film 13 may be previously formed on a metal foil to be the upper layer material 20 and the adherent sheet 12 may be bonded thereto or at least a part thereof may be impregnated therein.

(Composite Sheet)

In the composite sheet according to the present invention, an adherent sheet containing a thermosetting resin is adhered to a porous film or at least a part thereof is impregnated therein as described above. A resin having an excellent heat resistance and a high mechanical strength is preferable for the material of the porous film to be used in the present invention, and it is possible to employ various resins such as polyimide, polyester, polyamide, particularly, aromatic polyamide, polyamideimide, polyetherimide and polyether sulfone. Above all, a polyimide based resin is preferable because of an excellent insulating property and heat resistance and an excellent adhesion with a metal layer. Moreover, the aromatic polyamide is preferable because of an excellent insulating property and heat resistance and a lower coefficient of thermal linear expansion.

While a porous film may be used alone, it is also possible to form the porous film on the surface of a metal foil such as a copper foil or the surface of a resin film. In particular, the aromatic polyamide has a high adhesion with a polyester film during film formation and the polyester film may be used as a releasing film.

Examples of the method of forming a porous film include a wet coagulation process, a dry coagulation process and a drawing process. In order to obtain a sponge structure, the wet coagulation process is preferable. In the wet coagulation process, generally, a film forming solution (dope) having a resin and an additive dissolved in a solvent is prepared and is applied (cast) to a film forming base material, and is then immersed in a coagulating solution to carry out solvent substitution. Consequently, the resin is coagulated (changed into a gel) and the coagulating solution is then dried and removed. Thus, the porous film is obtained.

The polyamide based resin mainly including a repetition unit in which an acid residue and an amine residue are imide bonded may contain other copolymerized components and blended compounds. In respect of a heat resistance, a hydroscopic property and a mechanical strength, polyimide having an aromatic group as a main chain, for example, polyimide composed of a polymerized product containing a tetracarboxylic acid component and an aromatic diamine component can be employed. In particular, it is desirable that a polymer having a limiting viscosity of 0.55 to 3.00, preferably, 0.60 to 0.85 (a measured value at 30° C.) can be used. In the case in which a porous film is to be formed by the wet coagulation process, the polymer having the limiting viscosity within the above range can be formed into a porous film having an excellent dissolving property in a solvent, a great mechanical strength and independence.

Referring to the polyamide based resin, a polymer or a precursor thereof (polyamide acid) can be used for film formation. The polyamide acid has an advantage that a molecular structure is less restricted because it has a more excellent dissolving property as compared with polyimide. While the polymer may be completely changed into imide, 70% or more of a change rate to imide is permitted. In the case in which a polymer having a comparatively high change rate to imide is used for doping, it is preferable to use a polymer including, in a repetition unit, a component having a high flexibility such as butanetetradicarboxylic anhydride.

Any solvent for dissolving the polyimide based resin or the precursor thereof can be used. It is preferable to use an aprotic polar solvent such as N-methyl-2-pyrrolidone, N,N-dimethylacetamide, N,N-dimethylformamide or dimethylsulfoxide in respect of a dissolving property and a solvent substitution speed for a coagulating solvent in the case in which a porous film is formed by the wet coagulation process. Preferable examples include N-methyl-2-pyrrolidone. Moreover, a solvent such as diethylene glycol, dimethyl ether or diethyleneglycol diethylether may be mixed to regulate the speed of a solvent substitution in the wet coagulation process.

On the other hand, the aromatic polyamide includes so-called para type aramid and metha type aramid, and those in which a part of their main chain is substituted by diphenyl ether, diphenyl propane, diphenyl methane, diphenyl ketone, diphenyl sulfoxide or those in which biphenyl or a hydrogen group of an aromatic ring is substituted by a methyl group, a halogen atom or the like.

Examples of the para type aramid include poly p-phenyleneterephthalamide. The aramid thus constituted by only a rigid component is to be dissolved in a special reagent. For the aromatic polyamide used for the porous film, accordingly, it is preferable to at least partially use aramid having a part of main chain substituted by a component having a flexibility or the metha type aramid.

Examples of the component giving a flexibility include m-phenylene, 2,7-naphthalene, diphenyl ether, 2,2-diphenyl propane and diphenyl methane. Such components is used as a dicarboxylic monomer or a diamine monomer for copolymerization and is thus introduced into a bone structure. The component having a higher copolymerization ratio generally has a more excellent dissolving property for a solvent.

Examples of the solvent for dissolving the aromatic polyamide include tetramethyl urea, hexamethyl phospholamide, N,N-dimethyl acetamide, N-methyl-2-pyrrolidone, N-methylpiperidone-2, N,N-dimethylethylene urea, N,N,N', N'-tetramethyl allonic amide, N-methyl caprolactam, N-acethyl pyrrolidine, N,N-diethyl acetamide, N-ethyl pyrrolidone-2, N,N-dimethyl propionic amide, N,N-dimethyl isobutyl amide, N-methyl formamide, N,N-dimethyl propylene urea and their mixed systems. Furthermore, it is preferable to use an aprotic polar solvent such as N-methyl-2-pyrrolidone, N,N-dimethyl acetamide or N,N-dimethyl formamide in respect of a dissolving property and a solvent substitution speed for a coagulating solvent. More preferable examples include N-methyl-2-pyrrolidone.

Moreover, a solvent such as diethyleneglycol dimethy ether or diethyleneglycol diethyl ether or diethyleneglycol dibutyl ether may be mixed to regulate the speed of a solvent substitution.

Preferably, the doping in the wet coagulation process is carried out by application at a temperature of −20 to 40° C. Moreover, it is possible to use any coagulating solution which does not dissolve a resin to be used and has a compatibility with the solvent. For the coagulating solution, water, alcohols such as methanol, ethanol and isopropyl alcohol and their mixed solution can be used, particularly, the water can be used suitably. The temperature of the coagulating solution at time of immersion is not particularly restricted but a temperature of 0 to 90° C. is preferable.

The polymer concentration of a film forming solution preferably ranges from 5% by weight to 25% by weight, more preferably, 7% by weight to 20% by weight. If the concentration is too high, a viscosity is excessively increased and handling is hard to perform. If the concentration is too low, a porous film tends to be formed with difficulty.

In order to regulate a pore shape and a pore size, an inorganic material such as lithium nitrate or an organic material such as polyvinyl pyrrolidone can also be added. It is preferable that the concentration of an additive should be 1% by weight to 10% by weight in a solution. If the lithium nitrate is added, the substitution speed of a solvent and a coagulating solution is increased and a finger void structure (a structure having a finger-like void) is formed in a sponge structure. When an additive for reducing a coagulation speed such as polyvinyl pyrrolidone is added, it is possible to obtain a porous film having a sponge structure expanded uniformly.

By leaving the applied dope for a predetermined time (for example, one second to ten minutes), for example, in a 30° C. atmosphere having a relative humidity of 90% or more to absorb the water or the like before immersion in the coagulating solution, moreover, the pore size of the porous film in the vicinity of a surface may be regulated. In some cases, for example, the pore size can be increased by this operation to some extent with such a dope composition that a skin layer is formed on the surface.

The dope is applied to have a constant thickness and is immersed in a coagulating solution such as water and is thus coagulated or is left in a water vapor atmosphere and is thus coagulated and is then immersed in the water. Thus, the solvent is removed so that a porous film is formed. After the porous film is formed, it is taken out of the coagulating solution and is then dried. A drying temperature is not particularly limited but is desirably 200° C. or less.

In the case in which a porous film of a polyimide based resin is formed using a precursor thereof (polyamide acid), heat treatment is finally carried out at 200 to 500° C. and the precursor (polyamide acid) is heated and ring-closed to form polyimide.

Referring to the porous film according to the present invention, a mean pore size on the back face or surface of the porous film is preferably 0.05 µm or more, and more preferably, 0.1 to 5 µm in respect of impregnation property. In order to suitably fulfill the function of a prepreg, the vacancy rate of the porous film is preferably 30 to 98%, and more preferably 40 to 70%.

The thickness of the porous film is not particularly restricted. If the thickness is too great, a long time tends to be taken for the elimination of a solvent. Moreover, it has recently been desired that a multilayer wiring board should be thin, light and have a high mechanical strength. Therefore, it is preferable that the thickness should be from 90 µm to 5 µm.

In the present invention, the composite sheet obtained by compounding a porous film and an adherent sheet containing a thermosetting resin is used as described above. By impregnating the raw material composition of a thermosetting resin in the hole of the porous film, it is possible to obtain a composite sheet in which the porous film is impregnated with at least a part of an adherent sheet containing the thermosetting resin.

For a method of impregnating the raw material composition, it is possible to employ a method of directly applying a raw material solution of a thermosetting resin on the surface of a porous film by means of various coaters. However it is preferable to use a method in which a solid coated film obtained by coating the surface of a base material sheet with a raw material solution and drying the same surface is provided on the surface of the porous film and is impregnated by heating and pressurization. According to this method, it is possible to prevent aromatic polyamide from being swollen to deform the porous film due to a solvent contained in the raw material solution of the thermosetting resin. This method is also effective for obtaining a composite sheet having an adherent sheet adhered to a porous film.

Examples of the thermosetting resin include an epoxy resin, a phenol resin, a polyimide resin or polyamide acid. The epoxy resin, a mixture of the epoxy resin and other resins and the like are preferable in respect of a price and handling. The raw material solution of the thermosetting resin may contain a catalyst, a curing agent, a flame retardant, a filler, a plasticizer and an accelerator in addition to a solvent. Examples of the solvent contained in the raw material solution of the thermosetting resin include ketones, acetates, ethers, aromatic hydrocarbons, alcohols depending on the kind of the thermosetting resin.

A resin and a metal can be used for the base material sheet and a resin film is preferable. Examples of the coating method include coating methods using a blade coater, a comma coater, a roll coater, a calender coater and a bar coater in the case of direct coating or indirect coating. If a coating thickness is uniform, the thickness of the solid coated film is also uniform and the amount of impregnation can be uniform.

In order to dry the solvent, the solvent does not need to be removed completely but may be simply non-fluidized. For a drying method, heating drying and hot-air drying are preferable in respect of efficiency. Such a temperature that the curing reaction of the thermosetting resin does not progress excessively can be selected for a heating temperature.

Example of the heating and pressurizing method include a method using various thermal pressers and thermal laminators, apparatuses obtained by adding an evacuator thereto and the like. In the present invention, the thermal laminator is preferably used. By the heating and pressurizing operation, it is possible to manufacture a prepreg in which a porous film is impregnated with the half-cured substance of a thermosetting resin.

EXAMPLE

Description will be given to examples specifically showing the feature and effect of the present invention. The mean pore size and the vacancy rate of a porous film were measured in the following manner.

(1) Mean Pore Size of Porous Film

A mean pore size on a surface was obtained by photographing the surface of a porous film by means of a scanning electron microscope (SEM) and analyzing the image of the picture by means of a computer.

(2) Void Content of Porous Film

Void content (%)=$\{1-(weight/density)/volume\} \times 100$

The volume and the weight of a porous film were measured and a void content was calculated by the above equation using the density of a porous film material.

Example 1

A wiring pattern having a height of 18 µm and a line width of 300 µm was formed on both surfaces of a polyimide base material (a long side of 24 cm×a short side 17 cm) having a thickness of 5 µm to obtain a core substrate. For both surfaces of the core substrate, an aramid porous film (a thickness of approximately 28 µm, a mean pore size on a surface of 0.2 µm, a void content of 50%) obtained in the same manner as in a reference example 1, a composite sheet having an adherent sheet (a thickness of 45 µm) adhered thereto, and a copper foil (a thickness of 18 µm) to be an upper layer material were provided in order of the porous film, the adherent sheet and the copper foil from the inner layer side. The laminated product was heated and pressurized at 180° C. and 3 MPa for 60 minutes and was thus integrated. For the above adherent sheet, ABF45 manufactured by AJINOMOTO FINETECHNO CO., LTD. was used.

A change in a height was measured in such a direction as to pass over the wiring pattern over the surface of the laminated product by means of a surface roughness tester (light interfere type). As a result, a change in the height of 1 to 2 µm was obtained.

Comparative Example 1

A laminated product was integrated and a change in a height in such a direction as to pass over a wiring pattern was then measured in the same manner as the example 1 except that an aromatic polyamide nonwoven fabric (EA-541 manufactured by SHIN-KOBE ELECTRIC MACHINERY CO., LTD., a fiber diameter of approximately 10 µm) was used in place of the porous film and a prepreg previously impregnated thereto with the adherent sheet of the example 1 was used. As a result, a change in a height of approximately 15 µm was obtained.

Reference Example 1

A hexane solution of isophthalic chloride and an m-phenylene diamine aqueous solution were caused to react equimolarly so that aromatic polyamide was obtained. The aromatic polyamide (precipitate) was repeatedly washed by water and alcohol and water and was then dried in vacuum overnight at 60° C. so that a dry polymer was obtained. The polymer was dissolved in N-methyl-2-pyrrolidone (NMP), and furthermore, polyvinyl pyrrolidone (PVP) (manufactured by ISP JAPAN CO., LTD., K-90) and water were mixed so that a polymer solution (film forming solution) containing aromatic polyamide (100 parts by weight), NMP (900 parts by weight), PVP (40 parts by weight) and water (40 parts by weight) was obtained.

A PEN film having a thickness of 12 µm (manufactured by TEIJIN LIMITED, Teonex film) was coated with the solution in a thickness of 30 µm, and was immersed in a water tank at 60° C. to form a porous film. Furthermore, the film was preserved for twenty-four hours to eliminate a solvent. Thereafter, the film was dried at 80° C. for five hours so that a porous film stuck and formed integrally with the PEN film was obtained. The porous film thus obtained had a sponge structure in which a continuous hole having a thickness of 28 µm is formed. A mean pore size of 0.2 µm and a vacancy rate of approximately 50% were obtained.

For the porous film, a thermosetting resin composition comprising a 50% by weight solution of methylethyl ketone of a brominated bisphenol A-type epoxy resin was coated and impregnated in the porous film side. As a result, an excellent impregnating property could be obtained.

What is claimed is:

1. A method of manufacturing a wiring board comprising:
    preparing a composite sheet comprising: (i) a porous film having a top surface and a lower surface and (ii) an adherent sheet containing a thermosetting resin placed on or partially permeated within the top surface of the porous film;
    attaching a releasing resin film to the adherent sheet;
    preparing a wiring layer having wiring patterns formed on an insulting insulating layer;
    laminating the composite sheet on the wiring layer, said lower surface of the porous film being in contact with said wiring patterns of the wiring layer; and
    pressing the adherent sheet under heat, whereby the porous film is deformed to contact both the wiring layer and the insulating layer while the adherent sheet is permeated within the porous film and reaches the wiring layer.

2. A method of manufacturing a wiring board comprising:
    preparing a composite sheet having an adherent sheet containing a thermosetting resin adhered to a porous film or impregnated with at least a part thereof;
    laminating at least the composite sheet on a wiring layer having a wiring pattern formed on an insulating layer; and
    heating and pressurizing the laminated product thus obtained or heating and pressurizing it after the pressurization to integrate the laminated product, wherein the composite sheet having a releasing resin film attached to the adherent sheet is used.

3. The method according to claim 2, wherein the composite sheet having the adherent sheet adhered to a porous film is used and the laminating step is carried out by arranging the porous film side of the composite sheet onto the wiring layer.

4. The method according to claim 2, wherein the composite sheet having a porous film impregnated with a part of the adherent sheet and the laminating step is carried out by arranging the porous film side of the composite sheet onto the wiring layer.

5. The method according to claim 2, wherein the composite sheet having a porous film impregnated with the whole adherent sheet is used.

* * * * *